US012213252B2

(12) United States Patent
Farkas et al.

(10) Patent No.: US 12,213,252 B2
(45) Date of Patent: Jan. 28, 2025

(54) CPU FOR HEATSINK BASED POWER DELIVERY

(71) Applicant: DELL PRODUCTS L.P., Round Rock, TX (US)

(72) Inventors: Sandor Farkas, Round Rock, TX (US); Mark Smith, Georgetown, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 269 days.

(21) Appl. No.: 17/724,326

(22) Filed: Apr. 19, 2022

(65) Prior Publication Data

US 2023/0337360 A1    Oct. 19, 2023

(51) Int. Cl.
*H05K 1/11* (2006.01)
*H05K 1/02* (2006.01)

(52) U.S. Cl.
CPC .......... *H05K 1/113* (2013.01); *H05K 1/0215* (2013.01); *H05K 2201/093* (2013.01); *H05K 2201/09481* (2013.01)

(58) Field of Classification Search
CPC ........ H05K 1/11; H05K 1/113; H05K 1/0215; H05K 2201/093; H05K 2201/09481
USPC ......................................................... 361/748
See application file for complete search history.

(56) References Cited

U.S. PATENT DOCUMENTS

| 7,414,847 | B2 | 8/2008 | Xia et al. | |
|---|---|---|---|---|
| 7,447,035 | B2 | 11/2008 | Liu et al. | |
| 2016/0021748 | A1* | 1/2016 | Kageyama | H01L 23/552 361/767 |

* cited by examiner

*Primary Examiner* — Tremesha W Burns
(74) *Attorney, Agent, or Firm* — Larson Newman, LLP

(57) ABSTRACT

A CPU includes a processor die and a substrate. The processor die includes first signal contacts, power contacts, and ground contacts. The processor die is affixed and electrically coupled to the substrate on a first surface of the substrate. The substrate routes the first signal contacts to associated second signal contacts on a second surface of the substrate. The substrate further routes a subset of the power contacts to a power pad on the first surface of the substrate, and routes a subset of the ground contacts to a ground pad on the first surface of the substrate.

20 Claims, 7 Drawing Sheets

Side View

Top View

Bottom View

Top View

Bottom View

Top View

Side View

CPU FOR HEATSINK BASED POWER DELIVERY

FIELD OF THE DISCLOSURE

This disclosure generally relates to information handling systems, and more particularly relates to heatsink based power delivery for central processing units (CPUs).

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A CPU may include a processor die and a substrate. The processor die may include first signal contacts, power contacts, and ground contacts. The processor die may be affixed and electrically coupled to the substrate on a first surface of the substrate. The substrate may route the first signal contacts to associated second signal contacts on a second surface of the substrate. The substrate may further route a subset of the power contacts to a power pad on the first surface of the substrate, and route a subset of the ground contacts to a ground pad on the first surface of the substrate.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
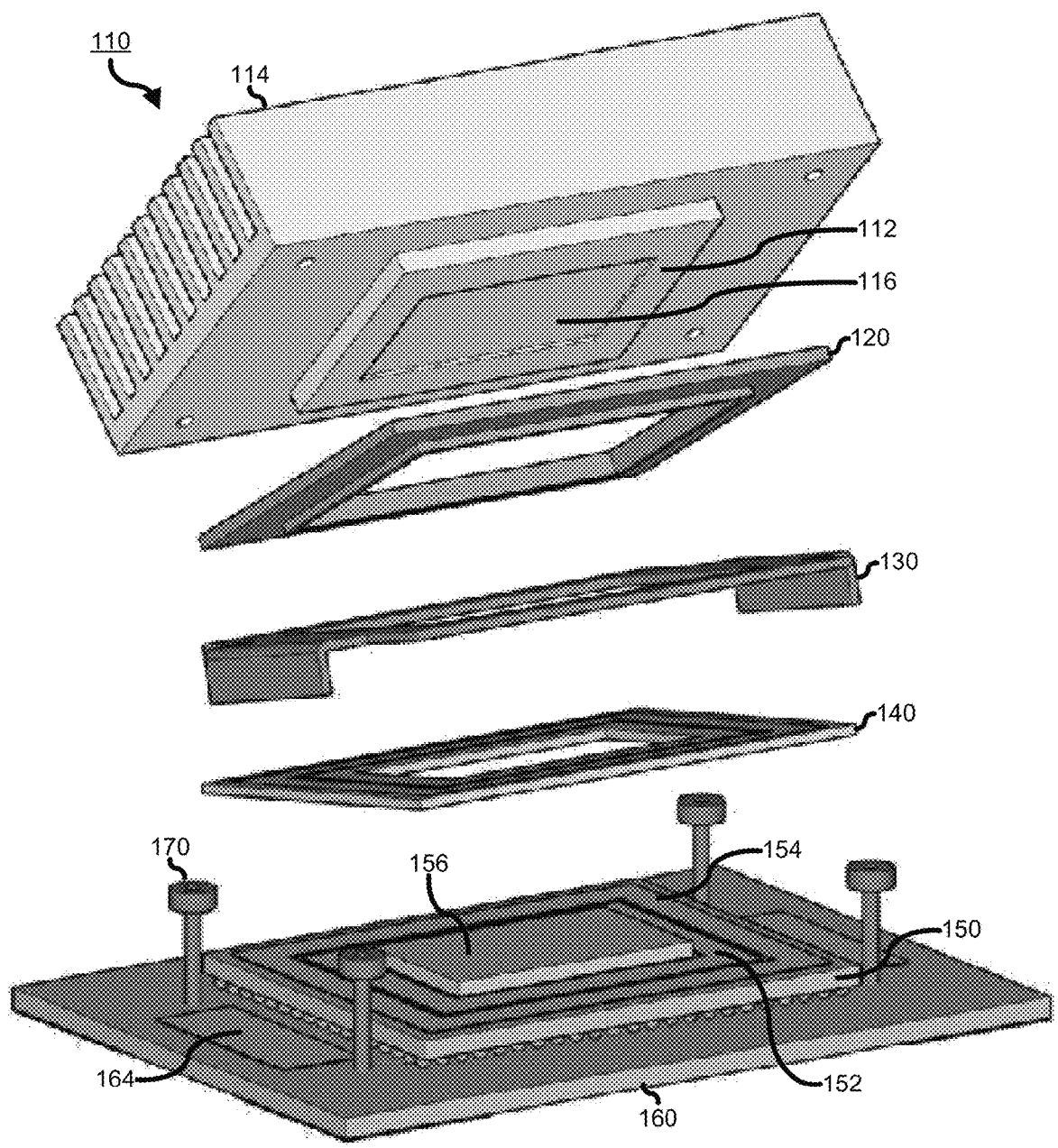
FIG. 1 is an exploded view of a processor mounting stack-up 100 according to an embodiment of the current disclosure.
Figure 2:
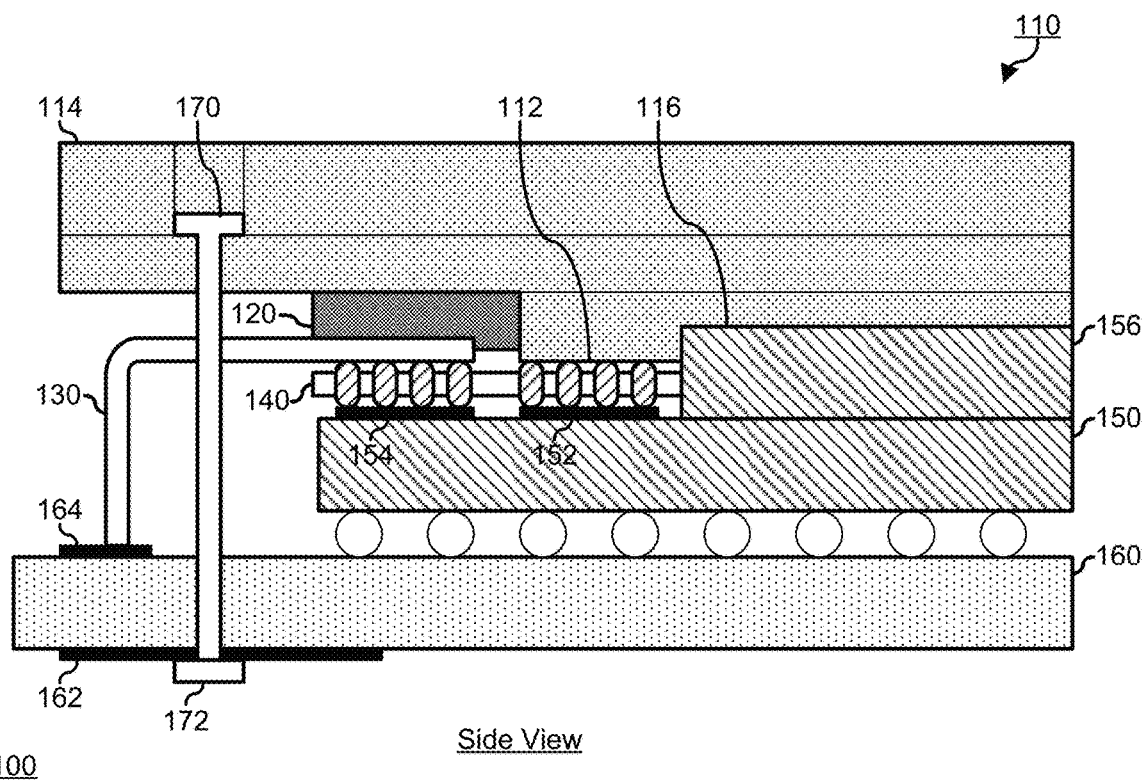
FIG. 2 is a view of the stack-up of FIG. 1 and illustrates a current flow in the stack-up of FIG. 1.
Figure 2:
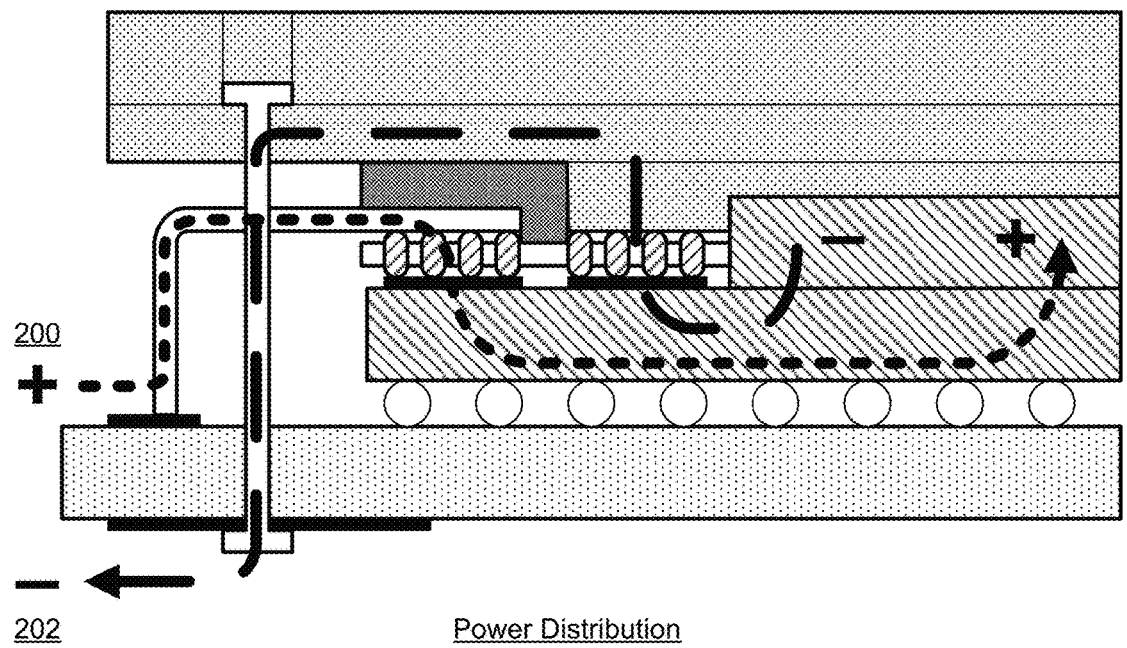
Figure 6:
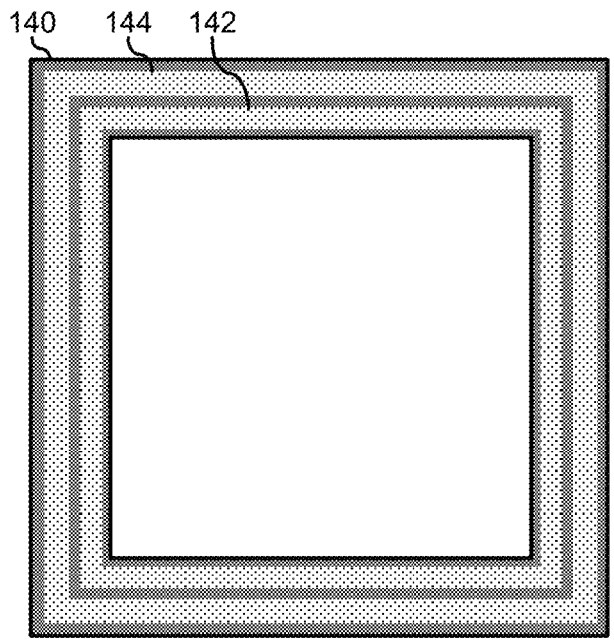
FIG. 6 is a top- and side-view of a conductive stack gasket of the stack-up of FIG. 1.
Figure 6:
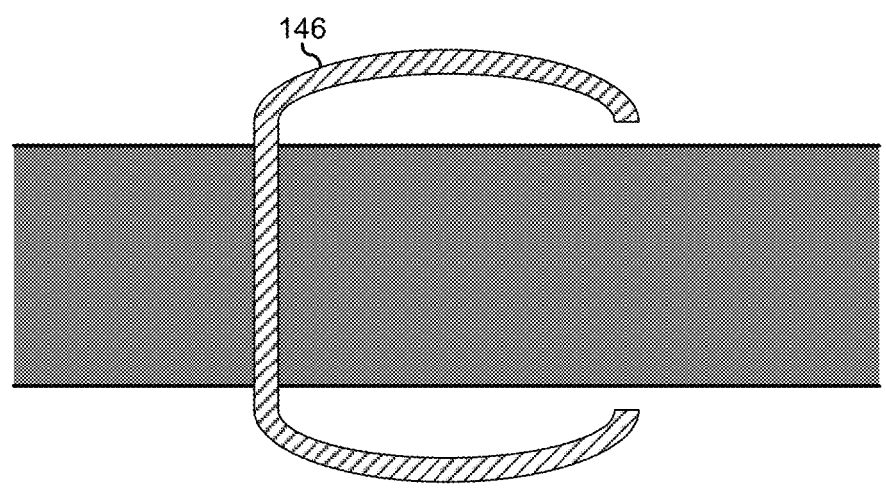

FIG. 1 illustrates an exploded view of a processor mounting stack-up 100 and FIG. 2 is a side view of the stack-up. Stack-up 100 is provided on an information handling system for mounting a central processing unit (CPU) to the information handling system. Stack-up 100 includes a heat sink 110, an insulating collar 120, a power delivery hat 130, a conductive stack gasket 140, a CPU 150, a printed circuit board (PCB) 160, and four (4) heat sink mounting bolts 170 and nuts 172. Heat sink 110 includes a ground contact surface 112, heatsink fins 114, and a thermal interface surface 116. Conductive stack gasket 140 (as illustrated in FIG. 6) includes a ground compression contact ring 142 and a power compression contact ring 144. CPU 150 includes a ground pad ring 152, a power pad ring 154, and a heat spreader 156. PCB 160 includes heat sink mounting bolt/ground pads 162 (hereinafter "ground pads 162," on an under side of the PCB, as illustrated in FIG. 2), and power pads 164.

Processor stack-up 100 will be understood to represent an assembly of the information handling system configured to securely affix CPU 150 to PCB 160. As such, stack-up 100 may represent any form of CPU attachment mechanism as may be known in the art. For example, stack-up 100 is illustrated such that CPU 150 is a ball-grid array (BGA) device that may be soldered to PCB 160, e.g., in a surface mount process. In another example, stack-up 100 may utilize a socketed attachment mechanism, such as where CPU 150 represents a pin-grid array (PGA) device. Here, PCB 160 will be understood to include a PGA socket connector to electrically connect, and mechanically retain CPU 150 to the information handling system. As such, stack-up 100 may include other elements, such as a PGA socket, a retainment mechanism, or other elements, as needed or desired. The mounting of processors on an information handling system, and in particular, processor mounting stack-ups, are known in the art, and will not be further described herein, except as may be needed to illustrate the current embodiments.

As the speed and functionality of CPUs increase, CPUs are requiring higher supply currents at lower operating voltages. As such, the pin count on CPUs is increasing, not only for signals, but also for power delivery. Moreover, as the speed of the interfaces on CPUs increases, the need for more localized power and ground delivery in order to assure good signal quality is also increasing. Thus a typical CPU may include over 300 power pins to deliver input power ($V_{CCIN}$) to the CPU, and over 300 ground pins (over 600 pins just for power and ground). This high pin count results in larger CPU packages and much greater complexity in routing power, ground, and signals to the CPU in the PCB. Furthermore, the large number of power and ground connections between the CPU and the PCB results in greater heat generation in the CPU package.

Figure 3:
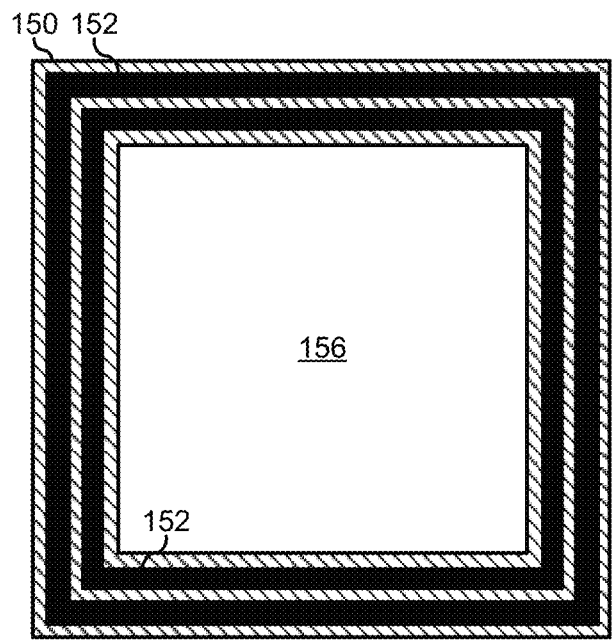
FIG. 3 is a top- and bottom-view of the CPU of the stack-up of FIG. 1.
Figure 3:
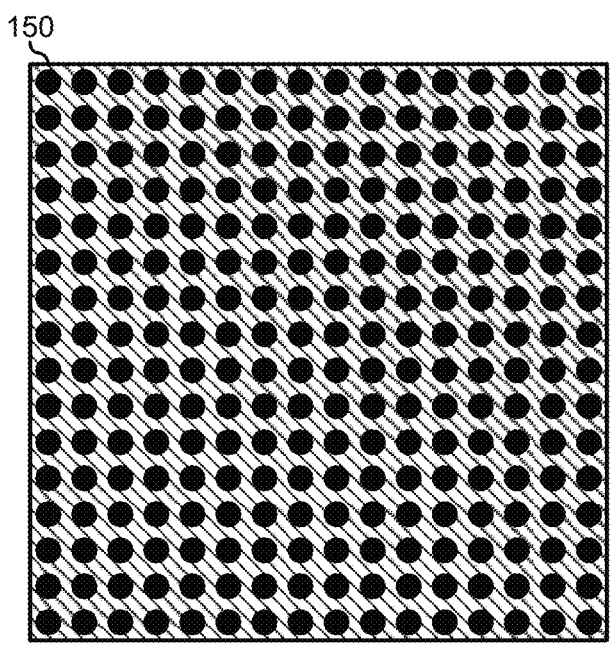
Figure 4:
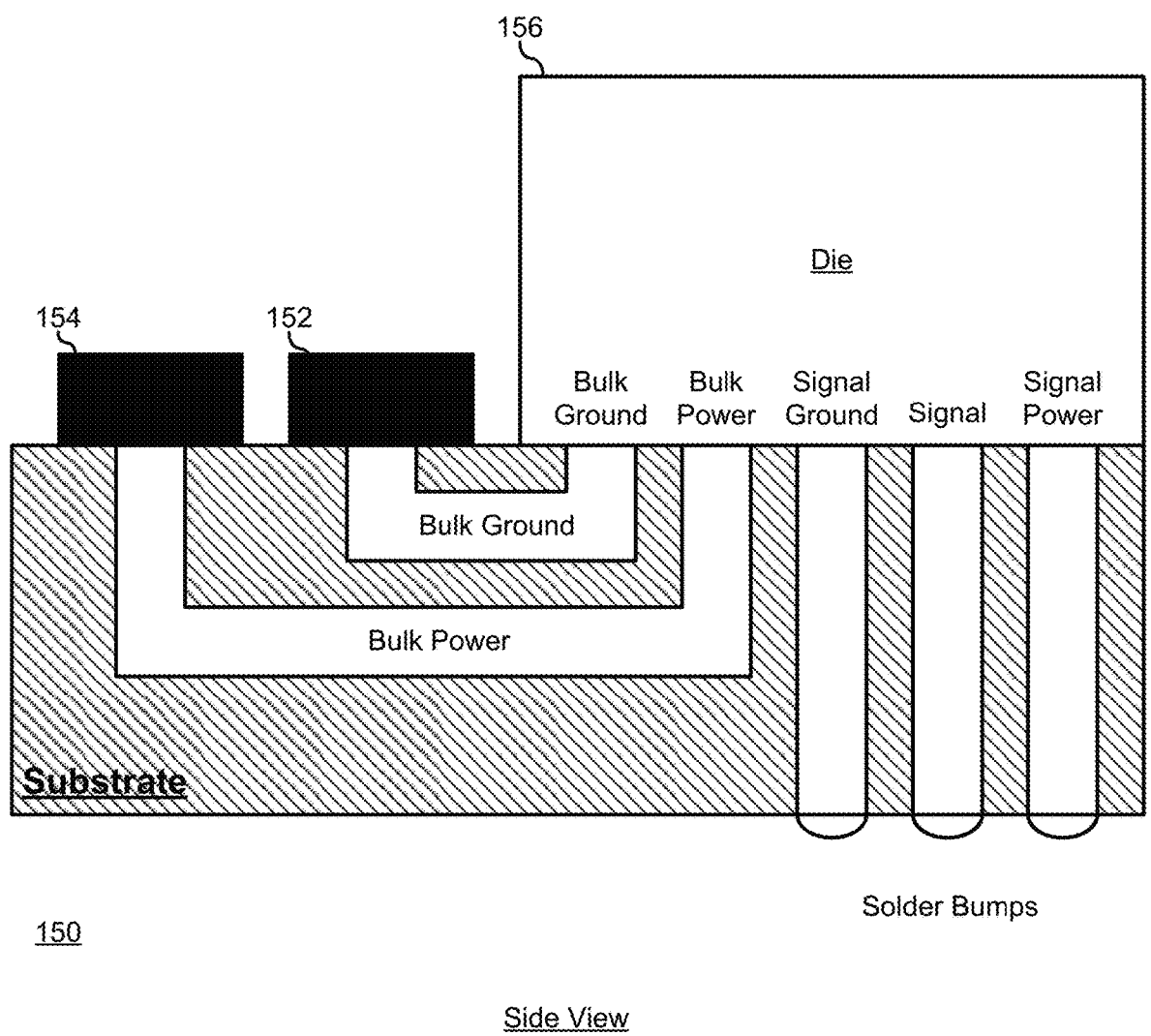
FIG. 4 is a side-view of the CPU of FIG. 1.

In a particular embodiment, stack-up 100 operates provide current to CPU 150 through the elements of the stack-up. In particular, as illustrated in FIGS. 3 and 4 and described further below, CPU 150 is configured to such that a portion of the ground contacts on a die of the CPU are route through a substrate of the CPU to ground pad ring 152, and a portion of the input power ($V_{CCIN}$) contacts on the die are routed through the substrate to power pad ring 154. Here, as illustrated by an input power flow 200 in FIG. 2, input power ($V_{CCIN}$) from one or more power plane of PCB 160 is routed to power pads 164, through power delivery hat 130 and power compression contact ring 144 of conductive stack gasket 140 to power pad ring 154 to provide input power input power ($V_{CCIN}$) to CPU 150 at power pad ring 154. Then, as illustrated by a return power flow 202 in FIG. 2, the return current from CPU 150 flows from ground pad ring 152 through ground compression contact ring 142 of conductive stack gasket 140, heat sink 110, and heat sink mounting bolts 170 and nuts 172 to ground pads 162. Here, one or more ground plane of PCB 160 is routed to ground pads 162.

In assembly, after CPU 150 is affixed to PCB 160, conductive stack gasket 140 is placed atop the CPU. Conductive stack gasket 140 is configured such that heat spreader 156 fits snugly into a cut-out center portion of the conductive stack gasket, such that a bottom side of ground compression contact ring 142 makes electrical contact with ground pad ring 152, and such that a bottom side of power compression contact ring 144 makes electrical contact with power pad ring 154. Power deliver hat 130 is placed atop conductive stack gasket 140. Power delivery hat 130 is formed of an electrically conductive material, such as copper, or other suitable materials, as needed or desired. Power delivery hat 130 is configured such that a bottom side of the power delivery hat makes electrical contact with a top side of power compression contact ring 144, but not with a top side of ground compression contact ring 142. Power delivery hat 130 is further configured to extend beyond the bounds of CPU 150, and is formed with downward extensions to make electrical contact with power pads 164 on PCB 160. Insulating collar 120 is placed atop power delivery hat 130, heat sink 110 is placed atop the insulating collar, and heat sink mounting bolts 170 are installed into the heat sink, through holes in PCB 160, and into nut 172, and tightened. In tightening heat sink mounting bolts 170 into nuts 172, thermal interface surface 116 is brought into good thermal contact with heat spreader 156, ground contact surface 112 makes electrical contact with a top side of ground compression contact ring 142 (as shown in FIG. 6) but not with a top side of power compression contact ring 144 (as shown in FIG. 6), and the heat sink mounting bolts make electrical contact with ground pads 162. Insulating collar 120 is formed of an insulating material, and operates to electrically isolate heat sink 110 from power delivery hat 130.

FIGS. 3 and 4 illustrate top-, bottom-, and side-views of CPU 150. In the top-view, CPU 150 is illustrated with ground pad ring 152, power pad ring 154, and heat spreader 156. Here, ground pad ring 152 and power pad ring 154 represent conductive surfaces on the top side of a substrate of CPU 150, and may be formed of any suitable conductive material such as copper or another conductive material, as needed or desired. In the bottom-view, the electrical connections of CPU 150 are illustrated as separate contacts. Here, where CPU 150 represents a surface mount device such as a BGA device, the contacts may be understood to represent solder bumps. Where CPU 150 represents a socketed device such as a PGA device, the contacts may be understood to represent connector pins. In other examples, the contacts may be any other suitable contact and attachment mechanism, as needed or desired. Here, a limited number of contacts are shown for simplicity of illustration, but it will be understood that a typical CPU will include more contacts or less contacts than are illustrated herein, as needed or desired. Moreover, CPU 150 should not be understood to necessarily be illustrated to scale, and a typical CPU may be understood to be smaller or larger than the illustrated CPU, as needed or desired.

Ground pad ring 152 and power pad ring 154 may be understood to carry all of the current associated with CPU 150, or may be understood to carry a portion of the current associated with the CPU. For example, a typical CPU may be understood to have a first current demand associated with the processing functions of the CPU, and a second current demand associated with input/output operations of the CPU. The first current demand may have less need to be closely collocated with the processing functions of the CPU, while the second current demand may need to be more closely collocated with the input/output signal contacts of the CPU. Here, the first current demand may be satisfied through ground pad ring 152 and power pad ring 154, while the second current demand may be satisfied through ground and power connectors on the bottom surface of CPU 150. In another embodiment, only a portion of the first current demand may be satisfied through ground pad ring 152 and power pad ring 154, while a remainder of the first current demand may be satisfied through ground and power connectors on the bottom surface of CPU 150. In a particular embodiment, the current flowing into power pad ring 154 and the current from ground pad ring 152 are configured to be substantially equal to each other. That is, the current capacity of ground pad ring 152 and power pad ring 154 may be configured to a common current rating. In another embodiment, one or the other of ground pad ring 152 and power pad ring 154 may be configured to carry a higher current than the other, as needed or desired. Here, for example, it will be understood that where the current capacity in ground pad ring 152 is higher than in power pad ring 154, then the number of the power connectors on the bottom side of CPU 150 may be greater than the number ground connectors.

The side-view of CPU 150, as illustrated in FIG. 4 shows a possible fabrication of the CPU. Here, a substrate of CPU 150 may be fabricated as a multilayer substrate, with signal, ground, and power layers interconnected by signal vias. In this case, through ground pad ring 152 and power pad ring 154 will each be understood to be connected to a CPU die by power paths which connect the respective through ground pad ring and power pad ring to ground contacts and power contacts of the CPU die. The circuit paths will be understood to include circuit vias and ground and power traces in the respective ground and power layers, as needed or desired. Similarly, signal ground, signal power, and signal connections will likewise be understood to route the respective circuits through the CPU substrate between the CPU die and the associated connectors on the bottom surface of the substrate. Here, the signal ground, signal power, and signal connections are illustrated as directly passing through the CPU substrate, but this is not necessarily so, and the contacts of the CPU die may be routed through the CPU substrate to various locations on the bottom surface of the CPU substrate as needed or desired. The details of multi-layer substrate fabrication and the forming of circuit traces therein are known in the art and will not be further described herein, except as needed to illustrate the current embodiments. In other embodiments, the interconnections between ground pad ring 152 and power pad ring 154 and the respective contacts of the CPU die are formed by other processes as needed or desired. For example, the interconnections between ground pad ring 152 and power pad ring 154 and the respective contacts of the CPU die may be formed by a redistribution layer (RDL) process, as needed or desired. The details of RDL fabrication are known in the art and will not be further described herein, except as needed to illustrate the current embodiments.

As illustrated, ground pad ring 152 and power pad ring 154 are continuous and concentric conductive surfaces on the top-side of the CPU substrate, but this is not necessarily so. In this regard, ground pad ring 152 and power pad ring 154 may each be formed as two or more separate contact surfaces as needed or desired. Further, ground pad ring 152 and power pad ring 154 may be formed of discrete contact points on the top-side of the substrate. Here, the discrete contact points may include features configured to elevate the contact point, such as where each discrete contact point includes a solder bump or another elevated feature, as needed or desired. Here, conductive stack gasket 140 will be understood to have respective ground compression contact ring 142 and power compression contact ring 144 that are configured to match the configuration of the associated ground pad ring 152 and power pad ring 154, as needed or desired. Further, other configurations of ground pad ring 152 and power pad ring 154 may be utilized as needed or desired. For example, ground pad ring 152 and power pad ring 154 may be configured as ground and power bars, with the ground bars located closer to heat spreader 156 and the power bars located closer to an edge of CPU 150. In another example, one or more power bar may be located on a first side of the CPU substrate and one or more ground bar may be located on an opposite side of the CPU substrate, as needed or desired.

Figure 5:
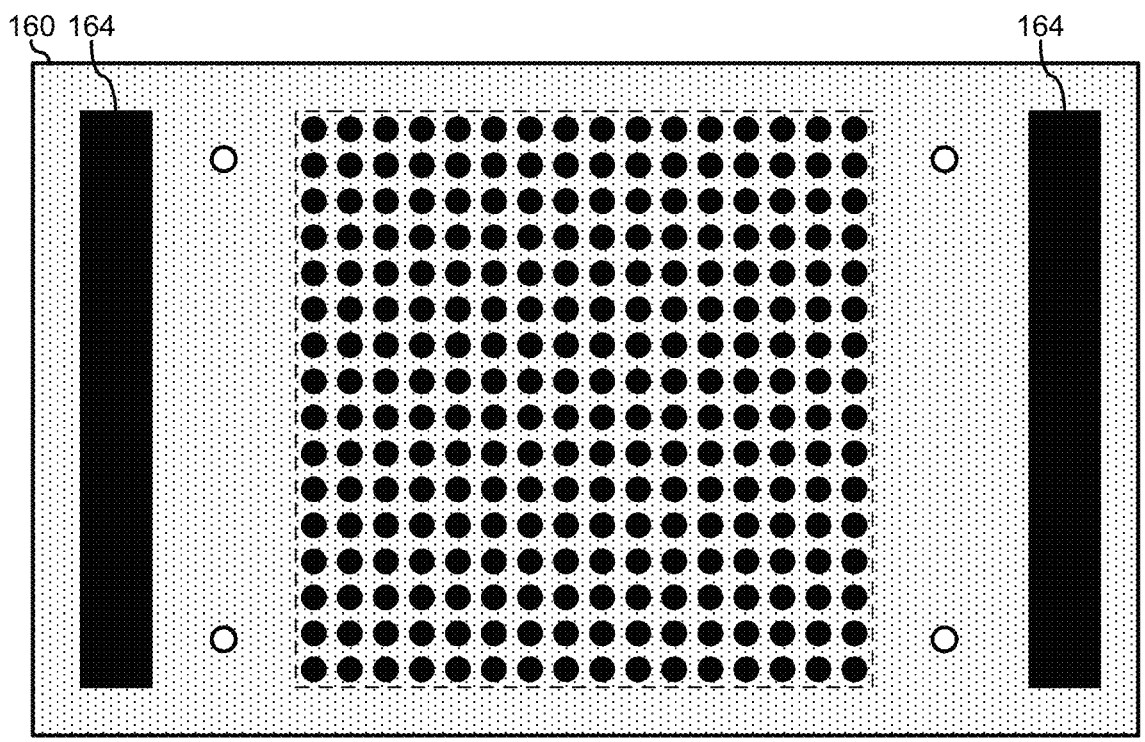
FIG. 5 is a top- and bottom-view of the PCB of the stack-up of FIG. 1.
Figure 5:
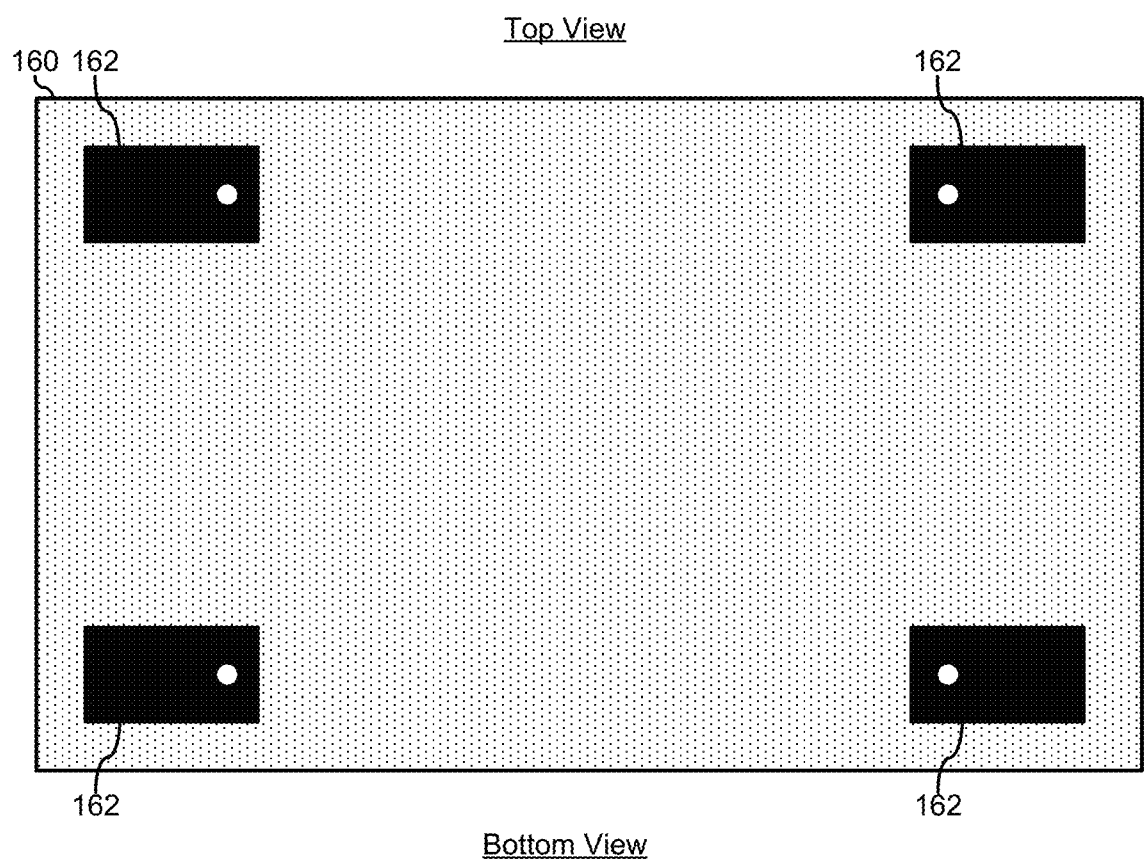

FIG. 5 illustrates top- and bottom-views of PCB 160. In the top-view, PCB 160 is illustrated with power pads 154. Here, power pads 164 represent conductive surfaces on the top side of PCB 160, and may be formed of any suitable conductive material such as copper or another conductive material, as needed or desired. In addition, the electrical connections of CPU 150 are illustrated as contacts on the top surface of PCB 160. Here, where CPU 150 represents a surface mount device such as a BGA device, the CPU contacts may be understood to represent solder pads. Where CPU 150 represents a socketed device such as a PGA device, the contacts may be understood to represent connector pins in a socket. In other examples, the contacts may be any other suitable contact and attachment mechanism, as needed or desired. As described above, a limited number of contacts are shown for simplicity of illustration. In the bottom-view, PCB 160 is illustrated with ground pads 162. Here, ground pads 162 represent conductive surfaces on the bottom side of PCB 160, and may be formed of any suitable conductive material such as copper or another conductive material, as needed or desired.

Ground pads 162 and power pads 654 may be understood to carry all of the current associated with CPU 150, or may be understood to carry a portion of the current associated with the CPU. For example, a first current demand of CPU 150 as described above may be satisfied through ground pads 162 and power pads 164, while the second current demand as described above may be satisfied through ground and power connectors on the top surface of PCB 160. In another embodiment, only a portion of the first current demand may be satisfied through ground pads 162 and power pads 164, while a remainder of the first current demand may be satisfied through ground and power connectors on the top surface of PCB 160. In a particular embodiment, the current flowing into power pads 164 and the current from ground pads 162 are configured to be substantially equal to each other, and the current capacity of the ground pads and the power pads may be configured to a common current rating. In another embodiment, one or the other of ground pads 162 and power pads 164 may be configured to carry a higher current than the other, as needed or desired. PCB 160 is typically fabricated as a multilayer substrate, with signal, ground, and power layers interconnected by signal vias. In this case, ground pads 162 and power pads 164 will each be understood to be connected to respective ground and power planes of PCB 160 with power and ground vias.

Power pads 164 are continuous conductive surfaces on the top side of PCB 160, and form a landing for the downward extensions of power delivery hat 130. Here, the tightening of heat sink mounting bolts 170 into nuts 172 operates to compress heat sink 110, insulating collar 120, and power delivery hat 130 such that the extensions of the power delivery hat form a reliable power connection to power pads 164. Here, a bottom edge of the extensions of power delivery hat 130 may have a straight profile. However, surface imperfections in power pads 164 may result in imperfect power connections between power delivery hat 130 and power pads 164. As such, in a particular embodiment, the bottom edge of the extensions of power delivery hat 130 may have a jagged profile such that, under compression, the tips of the jagged profile are firmly connected to the power pads to form a more reliable power connection.

Ground pads 162 are continuous conductive surfaces on the bottom side of PCB 160, and form a landing for heat sink mounting bolts 170 and nuts 172. In a first case, the force of tightening heat sink mounting bolt 170 into nut 172 serves to form a reliable ground connection between heat sink 110 and ground pads 162. In another case, nut 172 is soldered to ground pad 162 to ensure a reliable ground connection at the ground pad. In another embodiment, heat sink mounting bolt 170 is inserted up from the bottom of PCB 160 and heat sink 110 includes threaded holes into which the heat sink mounting bolt is tightened. While heat sink mounting bolts 170 are shown and described as a threaded bolt mechanism, this is not necessarily so and other conductive attachment mechanisms may be utilized as needed or desired. For example, a conductive rivet attachment mechanism or another conductive attachment mechanism may be utilized to firmly adhere heat sink 110 to CPU 150 for thermal, mechanical, and electrical mounting as described above, as needed or desired. Further, while four (4) heat sink mounting bolts are shown and described, a greater or a lesser number of heat sink mounting bolts may be utilized as needed or desired.

FIG. 6 illustrates a top- and side-view of conductive stack gasket 140. In the top-view, conductive stack gasket 140 is illustrated with ground compression contact ring 142 and power compression contact ring 144. Here, it will be understood that a bottom-view of conductive stack gasket 140 may be functionally visually similar to the top-view. Ground compression contact ring 142 and power compression contact ring 144 represent compressible conductive contact elements 146 that form electrical connections through conductive stack gasket. In particular, when contact elements 146 form ground compression contact ring 142, the conductive contacts of ground compression contact ring 142 connect ground pad ring 152 of CPU 150 to ground contact surface 112 of heatsink 110, and when contact elements 146 form power compression contact ring 144, the conductive contacts of power compression contact ring 144 connect power pad ring 154 of CPU 150 to power delivery hat 140. As illustrated, contact elements 146 represent compressible contact elements which, when stack-up 100 is tightened, form reliable electrical connections. Contact elements 146 may be formed of other conductive materials, such as solder bumps or other raised contact surfaces, as needed or desired. In another embodiment, only a portion of the first current demand may be satisfied through ground compression contact ring 142 and power compression contact ring 144, as needed or desired. In another embodiment, one or the other of ground compression contact ring 142 and power compression contact ring 144 may be configured to carry a higher current than the other, as needed or desired.

As illustrated, ground compression contact ring 142 and power compression contact ring 144 are continuous and concentric conductive surfaces on the top- and bottom-sides of the conductive stack gasket 140. However, this is not necessarily so, and ground compression contact ring 142 and power compression contact ring 144 may each be formed to conform with the configuration of respective ground pad ring 152 and power pad ring 154, as needed or desired. While the teachings of the current disclosure are provided in the context of CPU power delivery, this is not necessarily so, and the teachings of the current disclosure may be utilized in conjunction with other types of components that utilize a heat sink to dissipate heat from the component, and where the processor stack-up may reasonably be utilized for carrying power and ground current paths, as needed or desired.

Figure 7:
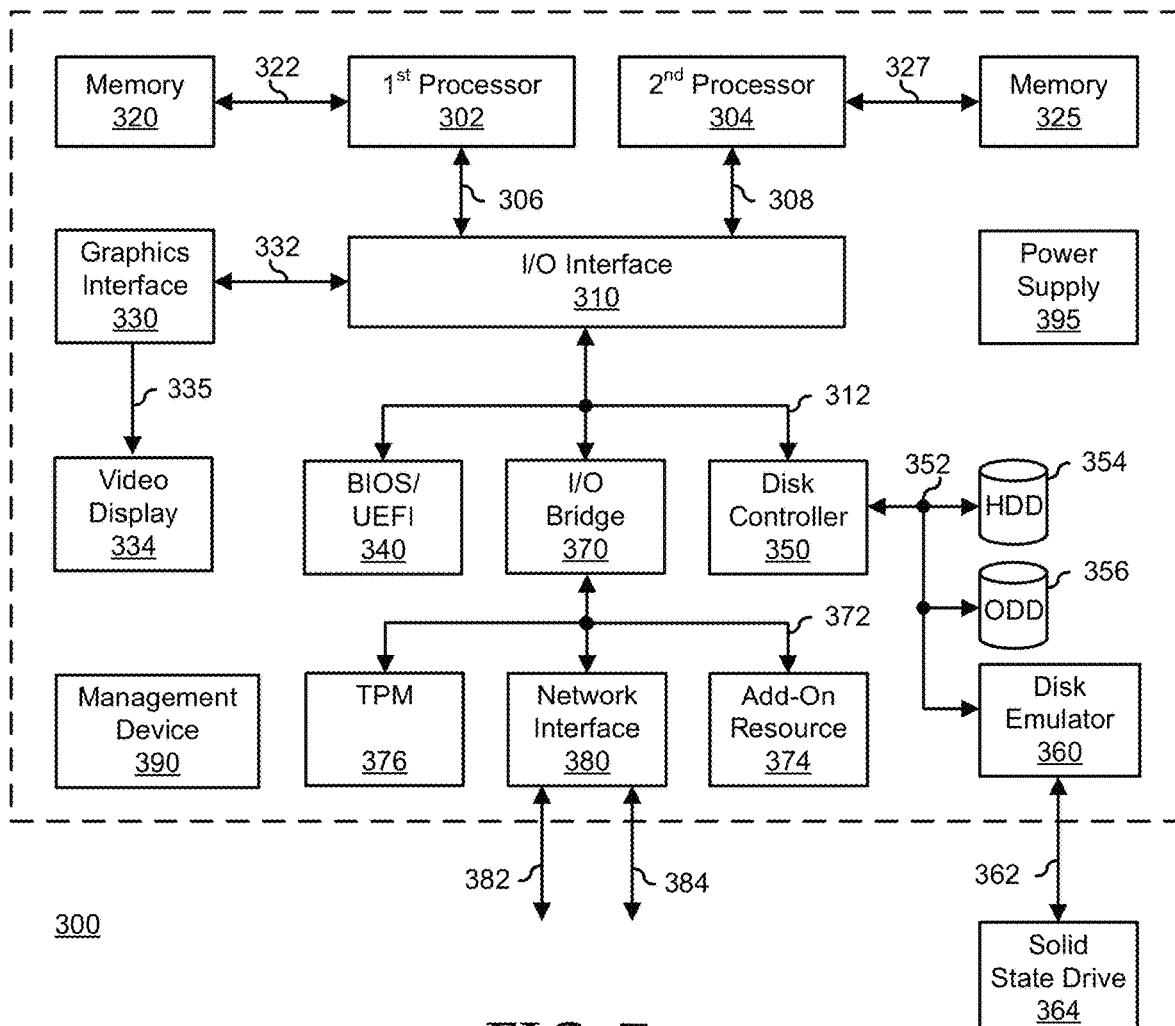
FIG. 7 is a block diagram illustrating a generalized information handling system according to another embodiment of the present disclosure.

FIG. 7 illustrates a generalized embodiment of an information handling system 300. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware. Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 364, an I/O bridge 370, one or more add-on resources 374, a trusted platform module (TPM) 376, a network interface 380, a management device 390, and a power supply 395. Processors 302 and 304, I/O interface 310, memories 320 and 325, graphics interface 330, BIOS/UEFI module 340, disk controller 350, HDD 354, ODD 356, disk emulator 360, SSD364, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 335 to a video display 334. In a particular embodiment, information handling system 300 includes separate memories that are dedicated to each of processors 302 and 304 via separate memory interfaces. An example of memories 320 and 325 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like.

Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A central processing unit (CPU) for an information handling system, the CPU comprising:
 a processor die including a plurality of first signal contacts, a plurality of first power contacts, and a plurality of first ground contacts; and
 a substrate, wherein the processor die is affixed and electrically coupled to the substrate on a first surface of the substrate, the substrate configured to route the first signal contacts to associated second signal contacts on a second surface of the substrate, to route a first subset of the first power contacts to a power pad on the first surface of the substrate, and to route a first subset of the first ground contacts to a ground pad on the first surface of the substrate.

2. The CPU of claim 1, wherein the substrate is a multi-layer substrate configured to route the first signal by signal traces in signal layers of the substrate and signal vias between the signal layers to the second signal contacts.

3. The CPU of claim 2, wherein the substrate is further configured to route the first subset of the first power contacts by power traces in power layers of the substrate and power vias between the power layers to the power pad, and to route the first subset of the first ground contacts by ground traces in ground layers of the substrate and ground vias between the ground layers to the ground pad.

4. The CPU of claim 2, wherein the substrate is further configured to route the first subset of the first power contacts by power traces in one or more power redistribution layer formed on the first surface of the substrate, and to route the first subset of the first ground contacts by ground traces in one or more ground redistribution layer formed on the first surface of the substrate.

5. The CPU of claim 1, wherein the substrate is further configured to route a second subset of the first power contacts to associated second power contacts on the second surface of the substrate, and to route a second subset of the first ground contacts to associated second ground contacts on the second surface of the substrate.

6. The CPU of claim 1, wherein the power pad is configured to carry a first current and the ground pad is configured to carry a second current different from the first current.

7. The CPU of claim 1, wherein the ground pad forms a first ring around the processor die and the power pad forms a second ring around the first ring.

8. The CPU of claim 1, wherein the power pad and the ground pad are formed to have a profile that is elevated from the second surface of the substrate.

9. The CPU of claim 1, wherein the ground pad includes a first ground pad region on a first side of the processor die, a second ground pad region on a second side of the processor die opposite from the first side, a first power pad region on the first side of the processor die, and a second power pad region on the second side of the processor die.

10. The CPU of claim 1, wherein the ground pad includes a first ground pad region on a first side of the processor die, a second ground pad region on a second side of the processor die opposite from the first side, a first power pad region on a third side of the processor die different from the first or second sides, and a second power pad region on a fourth side of the processor die opposite from the third side.

11. A method, comprising:
providing, on a processor die of a central processing unit (CPU), a plurality of first signal contacts, a plurality of first power contacts, and a plurality of first ground contacts; and
affixing and electrically coupling the processor die to a first surface of a substrate of the CPU;
routing, in the substrate the first signal contacts to associated second signal contacts on a second surface of the substrate;
routing a first subset of the first power contacts to a power pad on the first surface of the substrate; and
routing a first subset of the first ground contacts to a ground pad on the first surface of the substrate.

12. The method of claim 11, wherein:
the substrate is a multi-layer substrate; and
the method further comprises:
routing the first signal by signal traces in signal layers of the substrate and signal vias between the signal layers to the second signal contacts.

13. The method of claim 12, further comprising:
routing the first subset of the first power contacts by power traces in power layers of the substrate and power vias between the power layers to the power pad; and
routing the first subset of the first ground contacts by ground traces in ground layers of the substrate and ground vias between the ground layers to the ground pad.

14. The method of claim 12, further comprising:
routing the first subset of the first power contacts by power traces in one or more power redistribution layer formed on the first surface of the substrate; and
routing the first subset of the first ground contacts by ground traces in one or more ground redistribution layer formed on the first surface of the substrate.

15. The method of claim 11, further comprising:
routing a second subset of the first power contacts to associated second power contacts on the second surface of the substrate;
routing a second subset of the first ground contacts to associated second ground contacts on the second surface of the substrate.

16. The method of claim 11, wherein the power pad is configured to carry a first current and the ground pad is configured to carry a second current different from the first current.

17. The method of claim 11, wherein the ground pad forms a first ring around the processor die and the power pad forms a second ring around the first ring.

18. The method of claim 11, wherein the power pad and the ground pad are formed to have a profile that is elevated from the second surface of the substrate.

19. The method of claim 11, wherein the ground pad includes a first ground pad region on a first side of the processor die, a second ground pad region on a second side of the processor die opposite from the first side, a first power pad region on the first side of the processor die, and a second power pad region on the second side of the processor die.

20. A central processing unit (CPU) for an information handling system, the CPU comprising:
a processor die including a plurality of first signal contacts, a plurality of power contacts, and a plurality of ground contacts; and
a substrate, wherein the processor die is affixed and electrically coupled to the substrate on a first surface of the substrate, the substrate configured to route the first signal contacts to associated second signal contacts on a second surface of the substrate, to route the ground contacts to a ground pad ring on the first surface of the substrate around the processor die, and to route the power contacts to a power pad ring on the first surface of the substrate around the ground pad ring, wherein the power pad ring and the ground pad ring are formed to have a profile that is elevated from the second surface of the substrate.

* * * * *